United States Patent
Miyazaki et al.

[11] Patent Number: 5,872,719
[45] Date of Patent: Feb. 16, 1999

[54] METHOD OF WIRING SEMICONDUCTOR INTEGRATED CIRCUIT AND SEMICONDUCTOR INTEGRATED CIRCUIT

[75] Inventors: Yoshiaki Miyazaki; Katsuyoshi Suzuki, both of Hadano; Naoki Kato, Kodaira; Hiromitsu Yamada, Hadano, all of Japan

[73] Assignee: Hitachi, Ltd., Tokyo, Japan

[21] Appl. No.: 691,708

[22] Filed: Aug. 2, 1996

[30] Foreign Application Priority Data

Aug. 4, 1995 [JP] Japan ............................... 7-199621

[51] Int. Cl.⁶ .......................................... G06F 17/50
[52] U.S. Cl. .......................................... 364/491; 364/490
[58] Field of Search ................... 364/488, 489, 364/490, 491, 578

[56] References Cited

U.S. PATENT DOCUMENTS

| | | | |
|---|---|---|---|
| 3,621,208 | 11/1971 | Isett et al. | 235/150 |
| 3,644,937 | 2/1972 | Isett | 444/1 |
| 4,823,276 | 4/1989 | Hiwatashi | 364/491 |
| 4,903,214 | 2/1990 | Hiwatashi | 364/491 |
| 4,910,680 | 3/1990 | Hiwatashi | 364/491 |
| 5,124,273 | 6/1992 | Minami | 437/51 |
| 5,264,390 | 11/1993 | Nagase et al. | 437/180 |
| 5,272,645 | 12/1993 | Kawakami et al. | 364/491 |
| 5,295,082 | 3/1994 | Chang et al. | 364/490 |
| 5,375,069 | 12/1994 | Satoh et al. | 364/490 |
| 5,422,317 | 6/1995 | Hua et al. | 437/250 |
| 5,500,805 | 3/1996 | Lee et al. | 364/491 |
| 5,510,999 | 4/1996 | Lee et al. | 364/491 |
| 5,689,432 | 11/1997 | Blaauw et al. | 364/490 |

FOREIGN PATENT DOCUMENTS

| | | |
|---|---|---|
| 4-142060 | 5/1992 | Japan . |
| 4-245456 | 9/1992 | Japan . |
| 6-89311 | 3/1994 | Japan . |

*Primary Examiner*—Kevin J. Teska
*Assistant Examiner*—Leigh Marie Garbowski
*Attorney, Agent, or Firm*—Fay, Sharpe, Beall, Fagan, Minnich & McKee

[57] ABSTRACT

In designing wiring for semiconductor integrated circuits, wiring channels are assigned to reduce a signal delay time developed parallel traces. The selection of the wiring channels for all of the wiring oriented nets of the circuits is based on the trunk trace length between the terminals. For the longer trunk trace lengths, a double-pitch wiring channel is assigned. First, the determined trunk-trace lengths are sorted in decreasing order of length. Then, a double-pitch wiring channel is assigned for the trunk-trace lengths that are greater than a predetermined length. When no double pitch channels remain, single pitch channels are used.

20 Claims, 8 Drawing Sheets

ic circuit to be designed. A wiring specifications file 20 stores

METHOD OF WIRING SEMICONDUCTOR INTEGRATED CIRCUIT AND SEMICONDUCTOR INTEGRATED CIRCUIT

FIELD OF THE INVENTION

The present invention relates to a method of laying out the wiring a semiconductor integrated circuit, a semiconductor integrated circuit to which the wiring method is applied, and in particular to a wiring method suitable for reducing the signal delay time developed by a parallel trace in the wiring of a semiconductor integrated circuit, such as a multilayered interconnection structure.

BACKGROUND OF THE INVENTION

In designing wiring patterns for semiconductor integrated circuits, signal delay times have been taken into consideration. For example, Japanese Patent Application Laid-open No. 4-245456 discloses controlling the number of traces intersecting a noted or intended trace so as to reduce variations in signal delay time. It is also known from Japanese Patent Application Laid-Open No. 6-83911 that in searching for a wiring route or channel, a forbidden region can be set so that parallel wiring lengths are restricted in the region, whereby a signal delay time developed by parallel traces is reduced.

SUMMARY OF THE INVENTION

The design method referred to above in Japanese Patent Application Laid-Open No. 4-245456 has the problem that since variations such as an increase and decrease in signal delay time developed by the parallel trace are not taken into account, although the signal delay time developed by the capacity of each of the intersecting traces has been taken into consideration, the signal delay time varies due to the electric capacity of each parallel trace even if the number of intersecting traces is adjusted.

On the other hand, the second prior, Japanese Patent Application Laid-Open No. 4-245456, art has the problem that although the signal delay time is reduced by placing restrictions on the parallel wiring length, this approach is intended to set a forbidden region that simply eliminates the parallel traces, thus resulting in an ineffective utilization of the channels.

An object of the present invention is to provide a method of wiring a semiconductor integrated circuit, wherein a signal delay time developed by a parallel trace can be limited to a minimum by making the most effective use of restricted wiring channels, and a semiconductor integrated circuit embodying the wiring technology of the present invention.

When a semiconductor integrated circuit is automatically wired and designed according to the invention, wiring channels having a pitch equal to N (where N is an integer greater than or equal to 2) times the predetermined minimum wiring interval are used preferentially over wiring-oriented nets in decreasing order of wiring lengths, to thereby provide the wiring of the semiconductor integrated circuit. More particularly, wiring channels each having a pitch equal to N (where N is an integer greater than or equal to 2) times the predetermined minimum wiring interval are used preferentially over wiring-oriented nets in order from those whose wiring lengths exceed a reference length, to thereby provide the wiring.

Furthermore, when a semiconductor integrated circuit is automatically wired and designed according to the invention, a parallel wiring-length limiting value is determined according to the drive capability of an intended element of the circuit and a parallel wiring length is limited to less than or equal to the determined parallel wiring-length limiting value to thereby provide the wiring of the semiconductor integrated circuit.

Still further, when a semiconductor integrated circuit is automatically wired and designed according to the invention, a parallel wiring-length limiting value is determined according to the drive capability of an output of an intended element of the circuit and the distance at which another trace begins to adjoin a trace for the output thereof, and a parallel wiring length is limited to less than or equal to the determined parallel wiring-length limiting value.

According to the present invention, wiring channels each having a pitch equal to twice (generally plural times) the pitch of a normal wiring channel are preferentially used in the assignment of long traces to their corresponding wiring channels. Thus, the long traces can be prevented from being drawn in parallel at normal wiring pitches. Further, the allowable value of each parallel wiring length is strictly calculated from the drive capability of an element of the circuit and the distance from a source. Thus, since the parallel wiring length within the allowable value is allowed to be at a maximum, the wiring channels can be effectively utilized and the wiring ratio can be reduced to a minimum.

BRIEF DESCRIPTION OF THE DRAWINGS

FIGS. 2(*a*) and 2(*b*) are diagrams useful for describing a channel assigning method.

FIGS. 4(*a*) and 4(*b*) are diagrams useful for describing an example of a specific process of the first embodiment by reference to a two-dimensional layout.

FIGS. 6(*a*) and 6(*b*) are diagrams useful for describing an example of a specific process of the second embodiment by reference to a two-dimensional layout.

FIGS. 9(*a*) and 9(*b*) are diagrams useful for explaining the parallel wiring length resulting from the method performed according to the third embodiment of the invention shown in FIG. 8.

DETAILED DESCRIPTION OF THE PREFERRED EMBODIMENTS

Figure 1:
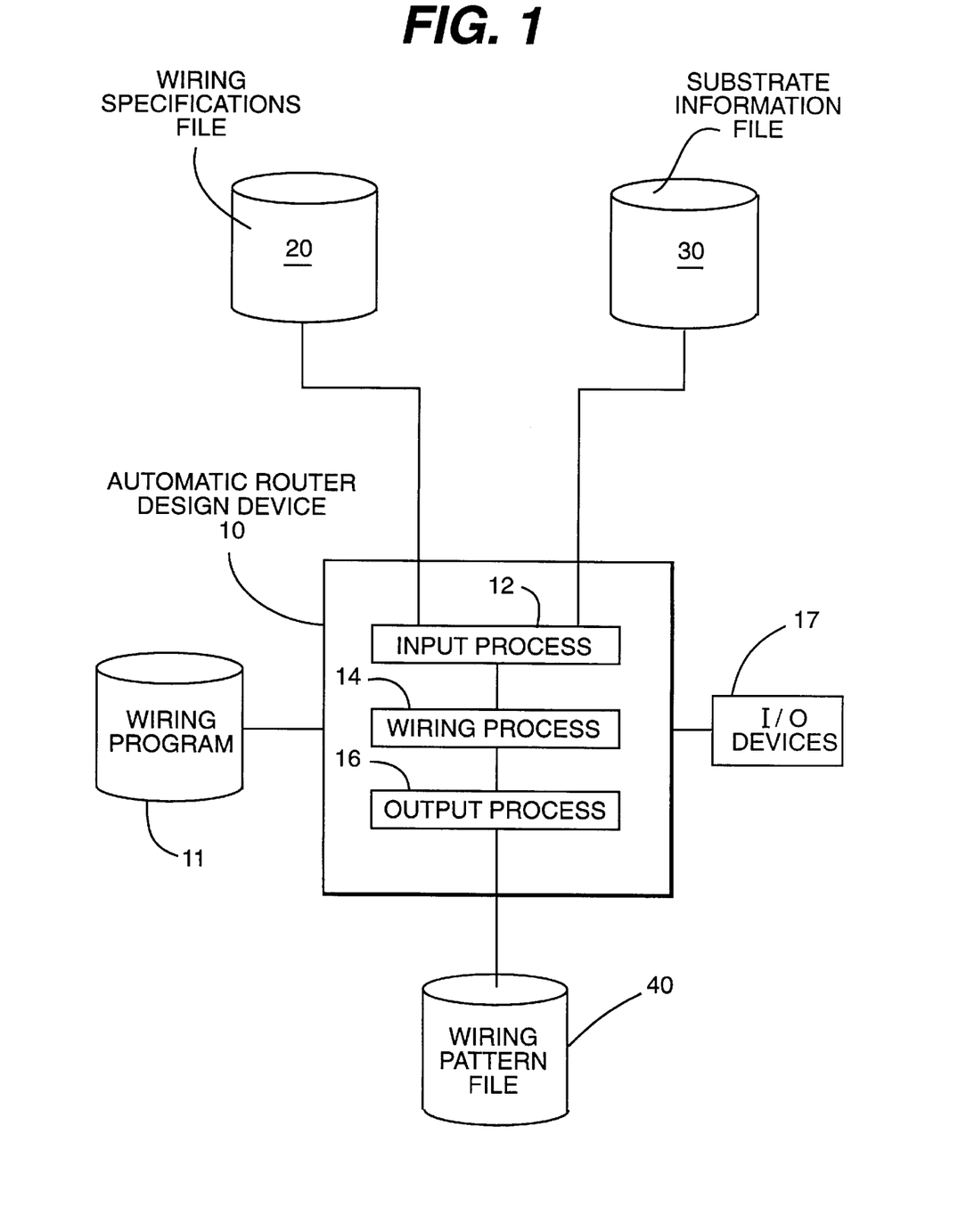
FIG. 1 is a schematic block diagram showing an example of an automatic router design system according to the present invention.

FIG. 1 is a schematic block diagram showing an example of an automatic router design system according to a preferred embodiment of the present invention, with which the wiring method according to the present invention can be performed. In the figure, a wiring specifications file 20 stores therein wiring specifications information (such as the position of each signal pin, a wiring net, etc.) about a wiring-oriented net group. As used herein, the term "net" means the gate to gate and terminal to terminal wiring for the whole LSI being wired. A substrate information file 30 stores therein substrate information (such as dimensions of a substrate, the number of layers, the shape of a wiring channel, etc.). An automatic router design device 10 is embodied, for example, by a computer (CPU) that receives the wiring specifications information and the substrate information from the wiring specifications file 20 and the substrate information file 30 as needed to automatically design a wiring pattern according to the invention. A wiring pattern file 40 stores therein the optimum wiring pattern information determined by the automatic router design device 10.

The wiring method is performed by executing software stored on a storage device 11, such as a hard disk or other storage media with a computer. The automatic router design device 10 performs processing that is roughly divided into an input process 12, a wiring process 14 and an output process 16. The input process 12 involves receiving logic information about patterns or traces each assigned to a terminal of a circuit element and physical information about the shape of a wiring channel, the position (the position of each signal pin) of each terminal of the circuit element, etc. input from the wiring specifications file 20 and the substrate information file 30 so as to produce data about a trunk line or trace and a branch line or trace or the relationship of a connection between the two, etc., which is necessary for the wiring process 14.

The router design device 10 performs the wiring process 14 by reading the data obtained in the input process 12 and executing a wiring pattern design process, i.e. executing the wiring design software stored in storage medium 11, that includes, as part of the design process, controlling the parallel wiring-length according to the present invention based on the input data with a channel assigning method as a base, for example. The output process 16 outputs the wiring pattern information resulting from the wiring process 14 to wiring pattern file 40 for storage. Further, the wiring pattern information can be output to an external device and additional data can be input through an input device, such I/O devices being schematically represented by I/O device block 17 in FIG. 1.

Figure 2A:
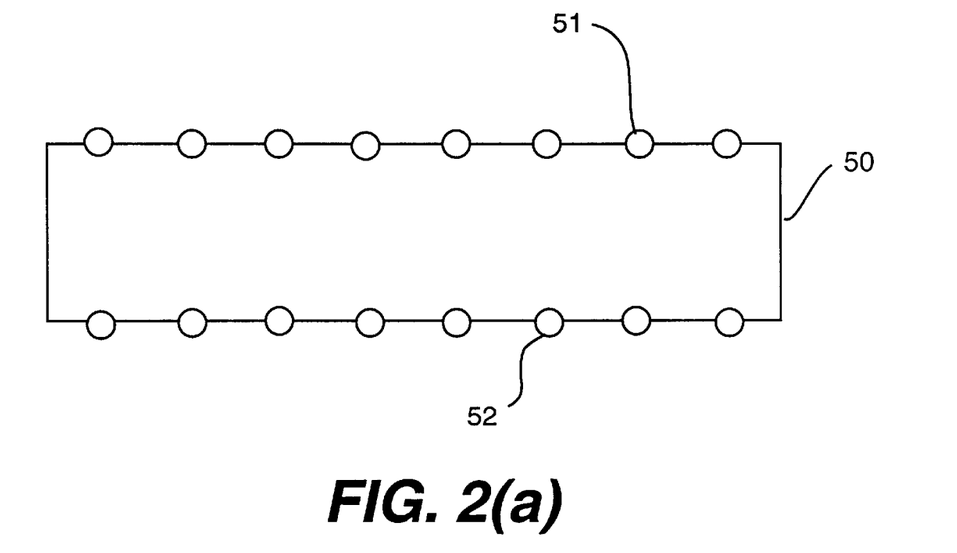
Figure 2B:
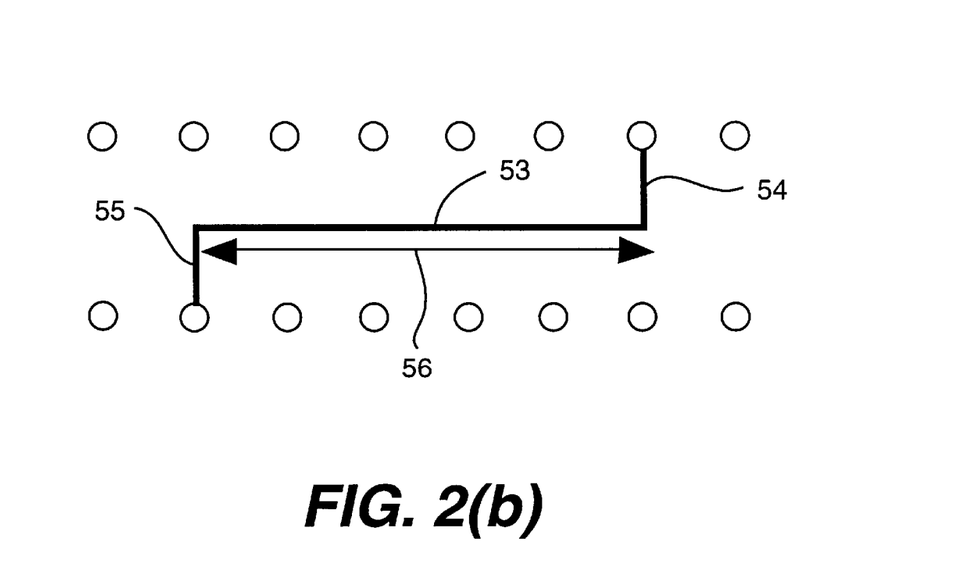

FIGS. 2(*a*) and 2(*b*) are diagrams useful for explaining a channel assigning method in a method of wiring between terminals, such as terminals 51 and 52 placed on the top and bottom sides of a rectangular region called a "channel region" 50. A trace 53 extending in the direction in which the channel region 50 extends and traces 54 and 55 normal to the trace 53 are respectively called a trunk trace and branch traces as shown in FIG. 2(*b*). Trunk trace 53 has a trunk-trace length 56, as shown in FIG. 2(*b*). Of course, the present invention is not limited to a particular channel assigning method.

The wiring pattern design process performed according to the present invention which includes parallel wiring-length control will now be described with reference to the following embodiments.

Embodiment 1

Figure 3:
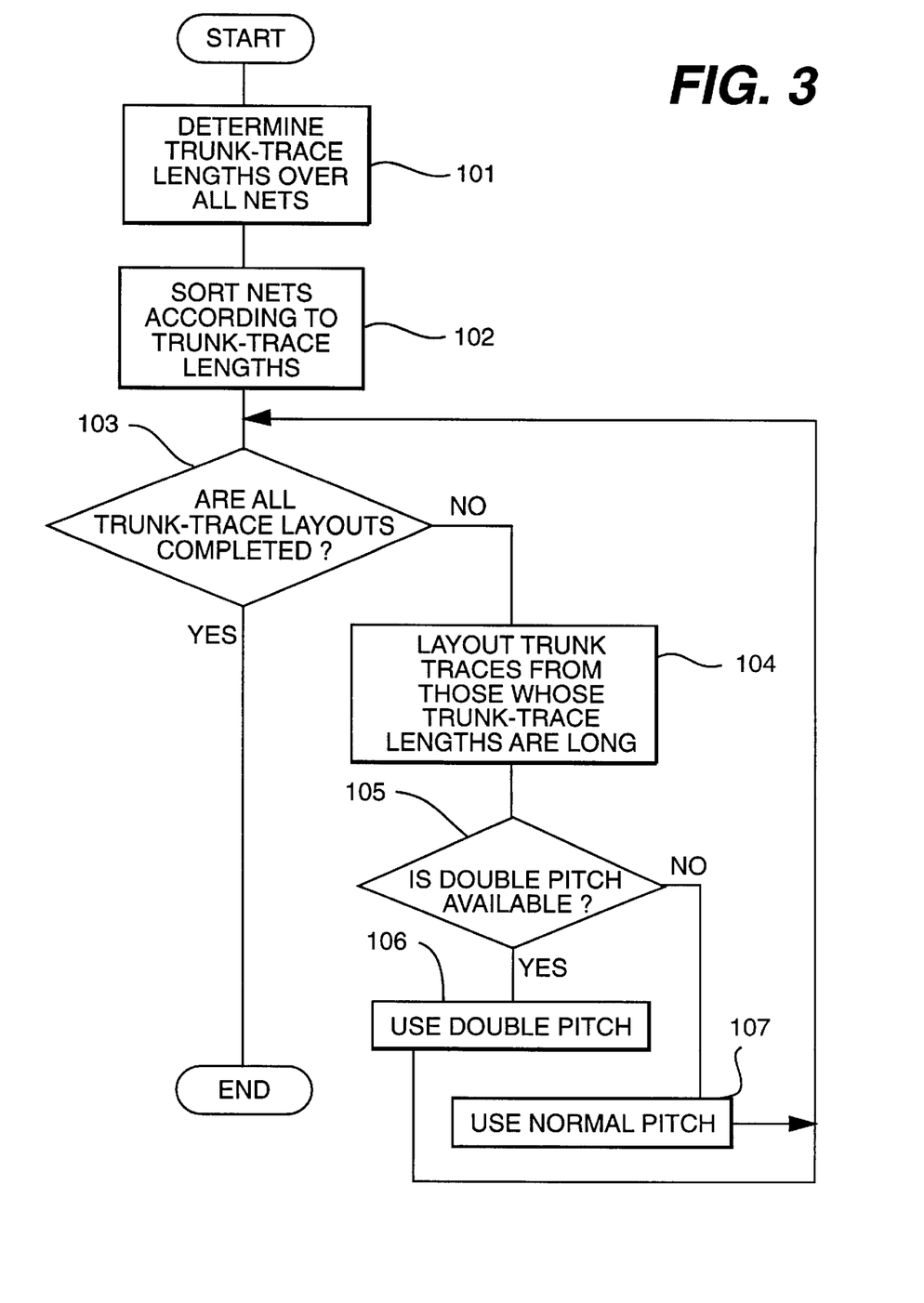
FIG. 3 is a flowchart for describing a processing operation of a first embodiment according to a method of the present invention.

FIG. 3 is a flowchart for describing the processing of a first embodiment illustrative of a method of wiring a semiconductor integrated circuit, for example an LSI, according to the present invention. First of all, the estimated lengths of the trunk traces relative to all of the wiring-oriented nets of the circuit being wired are respectively determined from the differences in coordinates between terminals, for example (step 101). Th e estimated lengths referred to above will be called "trunk-trace lengths". All the nets are wiring-oriented in th e present embodiment. However, when a net free from restraint on the parallel wiring length exists, the net can be eliminated as a matter of course.

Next, in step 102, the trunk-traces for the nets are sorted according to their lengths which are determined in step 101. At first, the trunk trace layouts are not completed, as determined in step 103, so a process of laying out the trunk traces is executed in order beginning with the trunk traces whose lengths are longest in step 104. At this time, a wiring channel having a pitch equal to one times the fixed minimum wiring interval (normal pitch) is preferentially used as a laying-out wiring channel, if available as determined in steps 105 and 106. The wiring channel having the normal pitch is used only when a double-pitch wiring channel cannot be used (step 107).

When the number of wiring layers is regarded as plural, each of the trunk-trace layout channels is changed for each layer. Even in this case, double-pitch wiring channels are used on a priority level. When the double-pitch wiring channels have been used up, the normal channels are used in that layer. The trunk-trace laying-out process is executed over all of the nets in the order determined in the sorting step 102 and the above process is finished when it is determined in step 103 that all trunk trace layouts have been completed.

In the embodiment described above, the wiring channels each having the pitch equal to two times the fixed minimum wiring interval (normal pitch) are preferentially used. That is, double pitch means twice the fixed minimum wiring interval. It is however within the scope of the invention that wiring channels each having a pitch equal to plural times (generally N times) the fixed minimum wiring interval can be used for laying out the trunk traces whose lengths are determined to be long.

When the parallel wiring-length control is executed between different layers in a semiconductor integrated circuit having a multilayered structure, the aforementioned trunk-trace laying-out process may be executed by dividing a trunk-trace layout layer into a top layer and a bottom layer, for example and spacing the traces away from each other. Alternatively, the aforementioned trunk-trace laying-out process may be executed by selecting a wiring layer capable of neglecting the influence of the parallel traces on delays. Owing to the present embodiment, the probability that long traces are adjacent to each other is reduced with the result that the parallel traces provided at normal pitch intervals can be reduced in length.

Figure 4A:
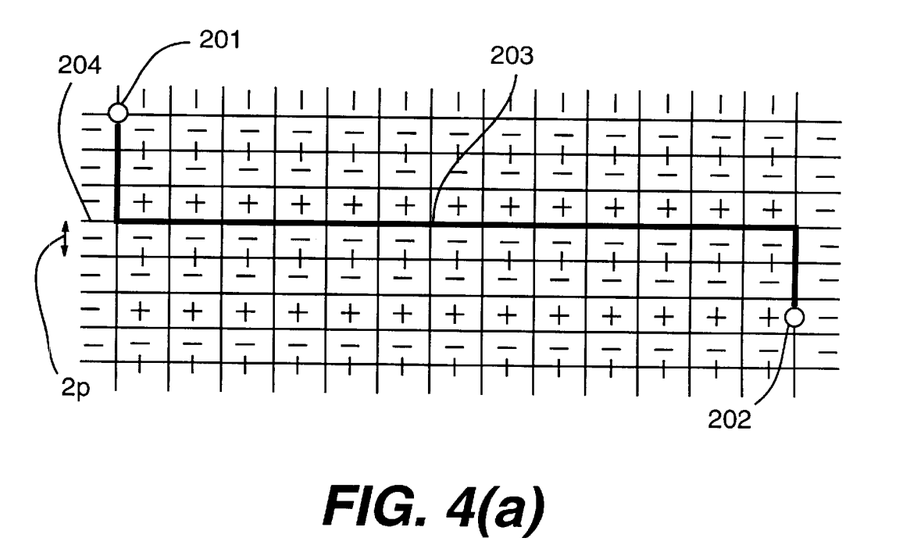
Figure 4B:
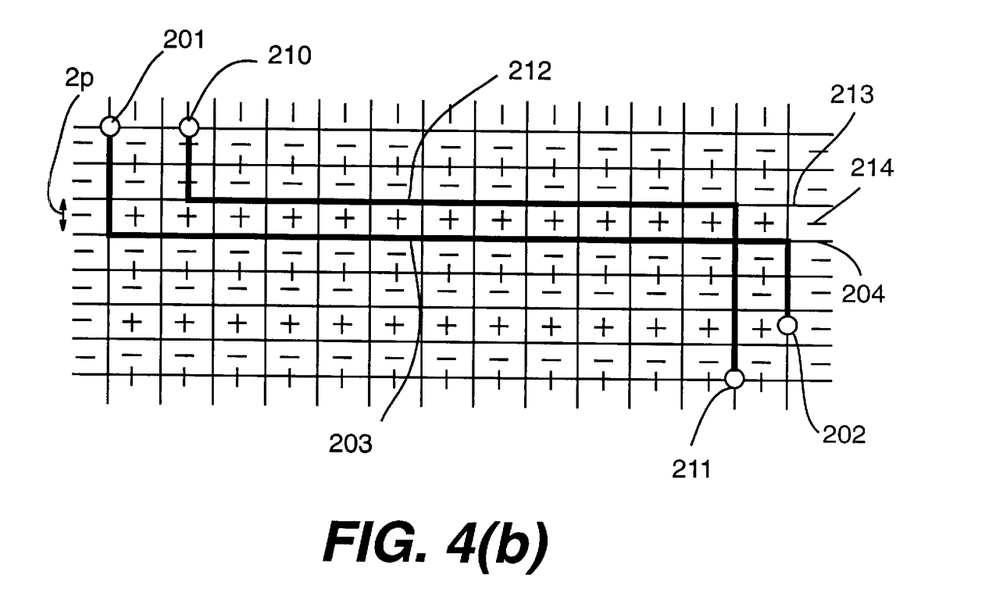

The present embodiment will be described specifically by a two-dimensional layout diagram with reference to FIGS. 4(*a*) and 4(*b*). When terminals 201 and 202 are electrically connected to each other as shown in FIG. 4(*a*), a trunk trace 203 is assigned to a channel 204, for example. A double-pitch wiring channel (2p) will hereinafter be defined with the channel 204 as the reference. When terminals 210 and 211 are next electrically connected to each other as shown in FIG. 4(*b*), a trunk trace 212 is assigned to a channel 213. The channel 213 shows a wiring channel having a pitch equal to the pitch of the channel 204 referred to above. Since a channel 214 adjacent to the channel 204 is a normal channel, channel 214 is refrained from being used. Such wiring exerts less influence on delay characteristics owing to the broad wiring interval (double pitch interval identified by 2p) although the trunk traces 214 and 212 are parallel traces, thereby making it possible to lay out the traces that satisfy the required characteristics.

Second Embodiment

Figure 5:
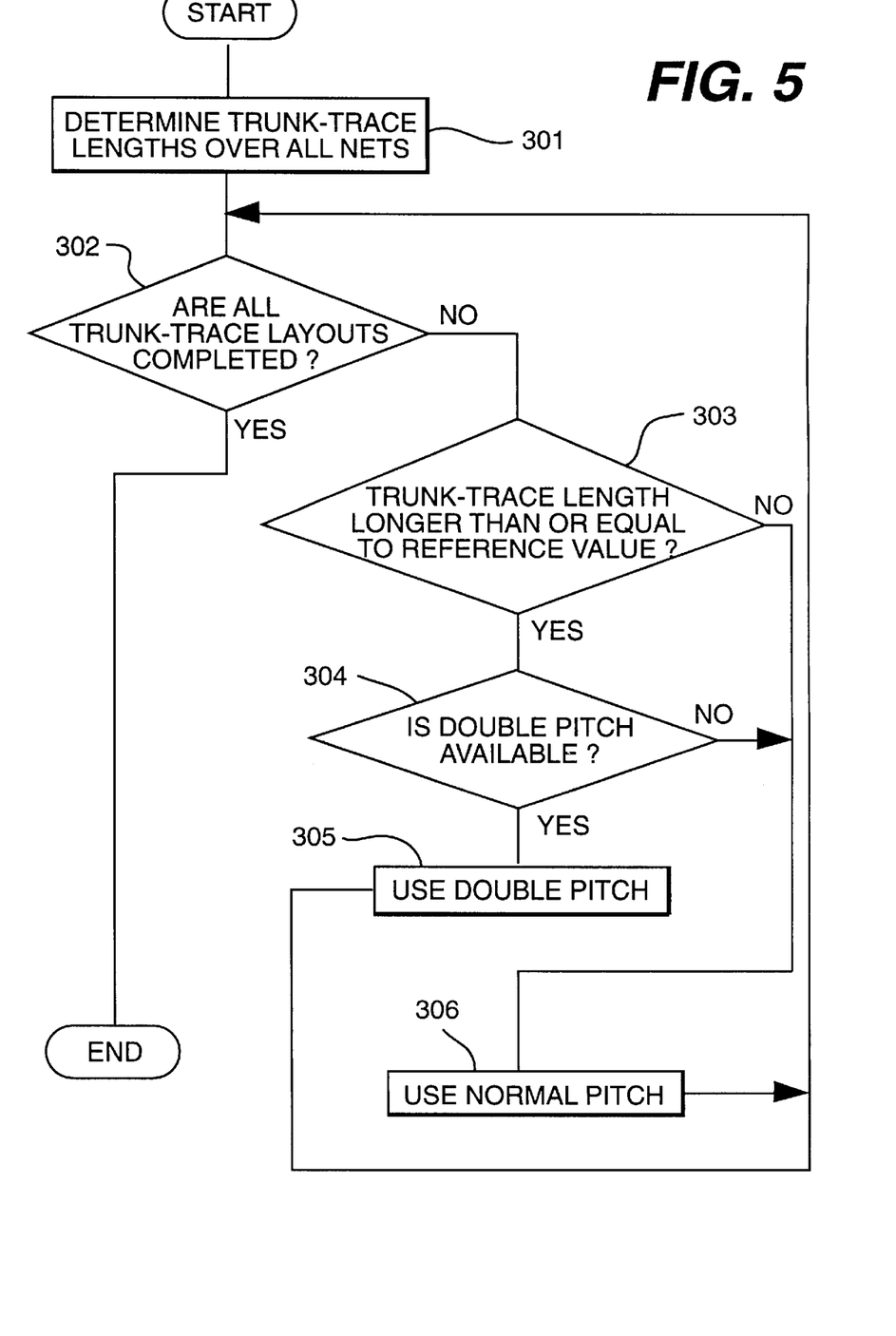
FIG. 5 is a flowchart useful for describing a processing operation of a second embodiment performed according to the method of the present invention.

FIG. 5 is a flowchart describing the processing of a second embodiment illustrative of a method of wiring a semiconductor integrated circuit, according to the present invention. Estimated lengths of trunk traces relative to all the wiring-oriented nets are first determined in step 301. This is carried out in a manner similar to the first embodiment. All the nets are wiring-oriented in the present embodiment. However, when a net free from having restraints placed on parallel wiring lengths exists, the net can be eliminated as a matter of course. Next, when the length of each trunk trace, which has been determined at step 301, is longer than or equal to a predetermined reference length in step 303, wiring channels each having a pitch equal to twice the defined minimum wiring interval (normal pitch) are preferentially used as wiring channels to be laid out (steps 304 and 305). The reference length is determined according to required characteristics such as delay and in accordance with the wiring material and assuming the lowest driving capability of an element of the circuit. In accordance with a preferred embodiment, the reference length is assigned to be about 60% of the longest trunk trace length subject to layout.

Wiring channels each having the normal pitch are used in step 306 only when the double-pitch wiring channels are not available as determined in step 304. When a trunk-trace length determined at step 301 is shorter than the reference length, a wiring channel having normal pitch is used (step 306). When the number of wiring layers is regarded as plural, each of the trunk-trace laying-out channels is changed for each layer. Even in this case, double-pitch wiring channels are used on a priority level. When the double-pitch wiring channels are used up, the normal channels are used in that layer. The trunk-trace laying-out process is executed over all of the nets and thereafter the above process is completed (step 302).

In the embodiment described above, the wiring channels each having a pitch equal to twice the fixed minimum wiring interval are preferentially used. It is however permitted to use wiring channels each having a pitch equal to plural times (generally N times) the fixed minimum wiring interval. When the parallel wiring-length control is executed even between different layers in a semiconductor integrated circuit having a multilayered structure, the aforementioned trunk-trace laying-out process may be executed by dividing a trunk-trace laying-out layer into a top layer and a bottom layer, for example and spacing traces away from each other by the spacing between traces. Alternatively, the aforementioned trunk-trace laying-out process may be performed by selecting a wiring layer capable of neglecting the influence of the parallel traces on delays.

Similarly to the first embodiment, the probability that long traces are adjacent to each other is reduced owing to the present embodiment, with the result that the parallel traces provided at normal pitch intervals can be reduced in length.

Figure 6A:
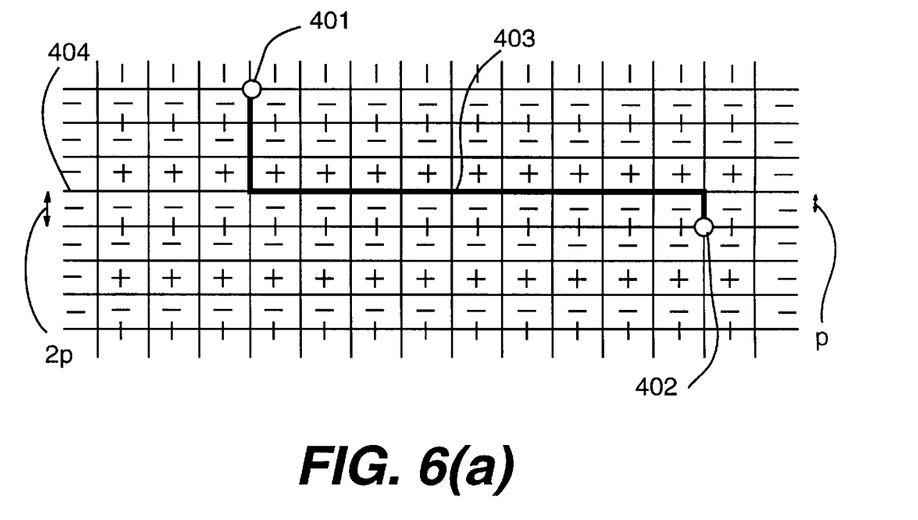
Figure 6B:
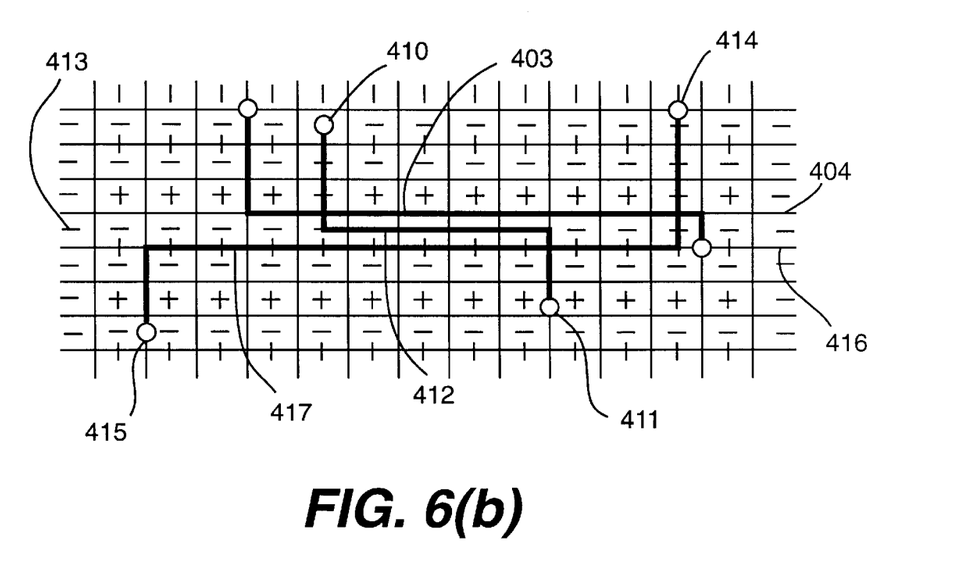

The present embodiment will be described specifically by reference to a two-dimensional layout diagram shown in FIGS. 6(a) and 6(b). When terminals 401 and 402 are electrically connected to each other as shown in FIG. 6(a), a trunk trace 403 is first assigned to a channel 404, for example. If the length of the trunk trace 403 is longer than or equal to the reference length at this time, then a double-pitch wiring channel will hereinafter be defined with the channel 404 as the reference. If the length of a trunk trace between terminals 410 and 411 is shorter than the reference length when the terminals 410 and 411 are next electrically connected to each other as shown in FIG. 6(b), then a trunk trace 412 is assigned to a channel 413 having a normal pitch. Further, if the length of a trunk trace between terminals 414 and 415 is longer than or equal to the reference length when the terminals 414 and 415 are electrically connected to each other, then a trunk trace 417 is assigned to a wiring channel 416 having a pitch equal to the pitch of the channel 404. Such wiring exerts less of an influence on delay characteristics owing to the broad wiring interval (double pitch) although the trunk traces 403 and 417 are parallel traces, thereby making it possible to lay out the traces that satisfy the required characteristics.

Third Embodiment

Figure 7:
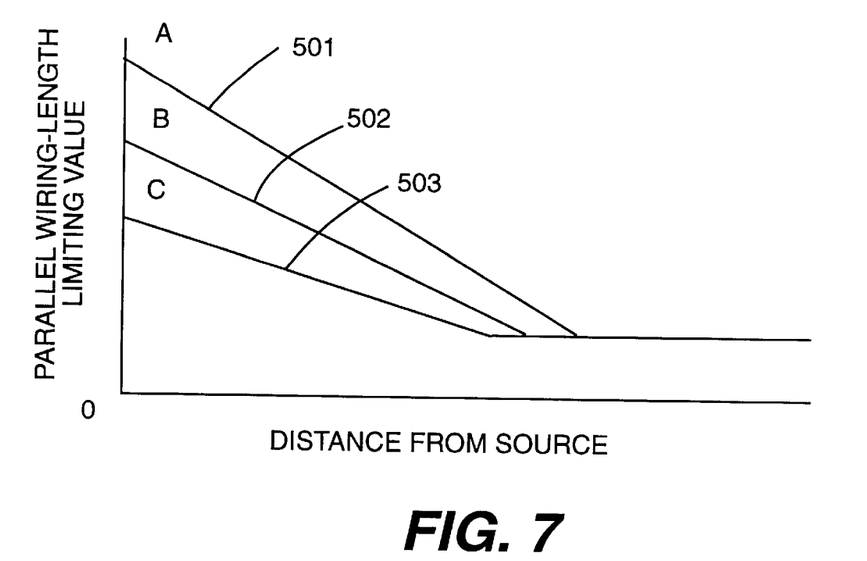
FIG. 7 is a view showing the relationship between the parallel wiring-length limiting value and the distance from the source according to the source-to-gate drive capability.

In the third embodiment, a parallel wiring-length limiting value is determined according to the drive capability of an element (element of the circuit, such as a gate) or the output (source) of an intended element and the distance at which one trace begins to adjoin a trace for the source. Further, traces are formed as parallel traces whose wiring lengths are limited to the parallel wiring-length limiting value or less. FIG. 7 shows the relationship between the parallel wiring-length limiting value and the distance from the source according to the source-to-gate drive capability. The drive capability has the relations of A>B>C, that is the drive capability C is the lowest.

Figure 8:
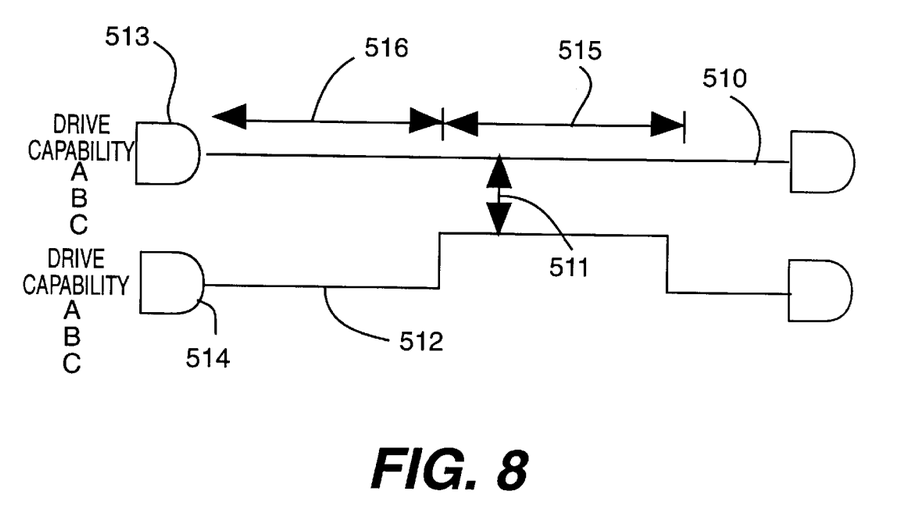
FIG. 8 is a view useful for describing the determination of the parallel wiring-length limiting value according to a third embodiment of the method of the present invention.

The present embodiment will be described below with reference to FIG. 8. Consider that reference number 510 indicates an intended net. A net 512 adjacent to the intended net 510 at an adjacent trace-to-trace distance 511 or less is determined on the basis of the required characteristics of a circuit existing after the wiring layout has been completed.

The drive capability of a source 513 of the intended net 510 will be represented at three levels of A, B and C in the form of the magnitude of their output currents, for example.

Similarly, the drive capability of a source 514 of the net 512 will be decided at three levels of A, B and C, where the drive capabilities satisfy the relation A>B>C, as mentioned.

When the drive capability of the source 513 is greater than that of the source 514, e.g., when the source 513 is represented as A and the source 514 is represented as C, a parallel wiring-length limiting value 515 of the intended net 510 is increased with respect to the intended net 510. On the other hand, when the drive capability of the source 513 is lower than that of the source 514, the parallel wiring-length limiting value 515 is reduced. When a distance 516 at which the net 512 starts to adjoin the intended net 510 is long, the parallel wiring-length limiting value 515 is reduced with respect to the intended net 510. On the other hand, when the distance 516 is short, the parallel wiring-length limiting value 515 is increased.

The maximum and minimum values of the parallel wiring-length limiting value 515 are determined based on information about design rules, etc. When the drive capability of the source 514 is fixed at a given value and the drive capability of the source 513 is set as A, B and C, parallel wiring-length limiting values 515 corresponding to their drive capabilities are represented as 501, 502 and 503 as shown in FIG. 7. Thus, the parallel wiring-length limiting value 515 of the intended net 510 can be strictly determined. Further, the parallel wiring-length limiting value 515 of the intended net 510 can be varied according to the distance 516 at which the net 512 begins to adjoin the net 510. If the distance 516 is short, then the parallel wiring-length limiting value 515 is brought to a long restricted length. When the distance 516 exceeds a given value as shown in FIG. 7, the parallel wiring-length limiting value 515 is brought to a constant value.

According to the present embodiment, a net whose parallel wiring length exceeds the parallel wiring-length limiting value, can be detected. It is also possible to lengthen each parallel trace to the limit. Namely, a net having a parallel wiring length shorter than the parallel wiring-length limiting value can effectively use channels by improving wiring with the limiting value as a target value.

Figure 9A:
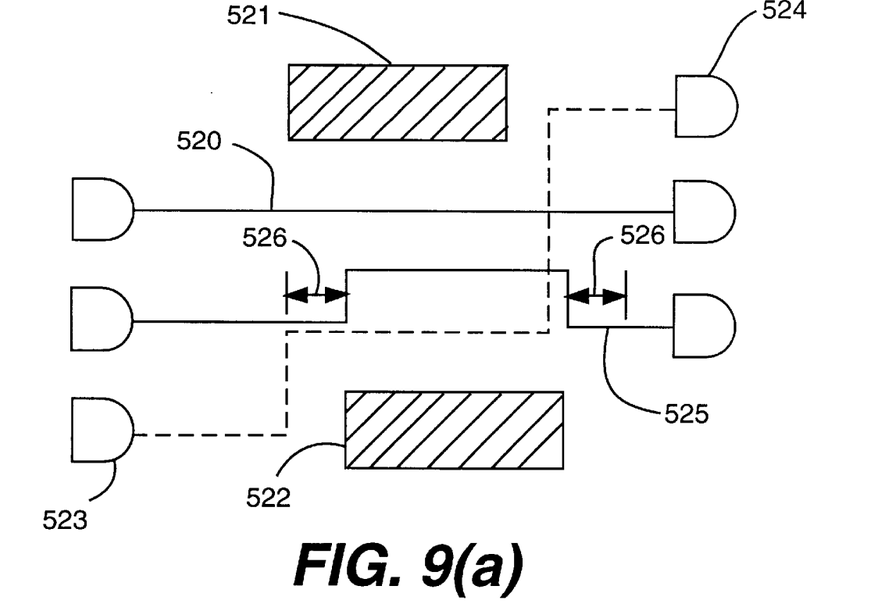
Figure 9B:
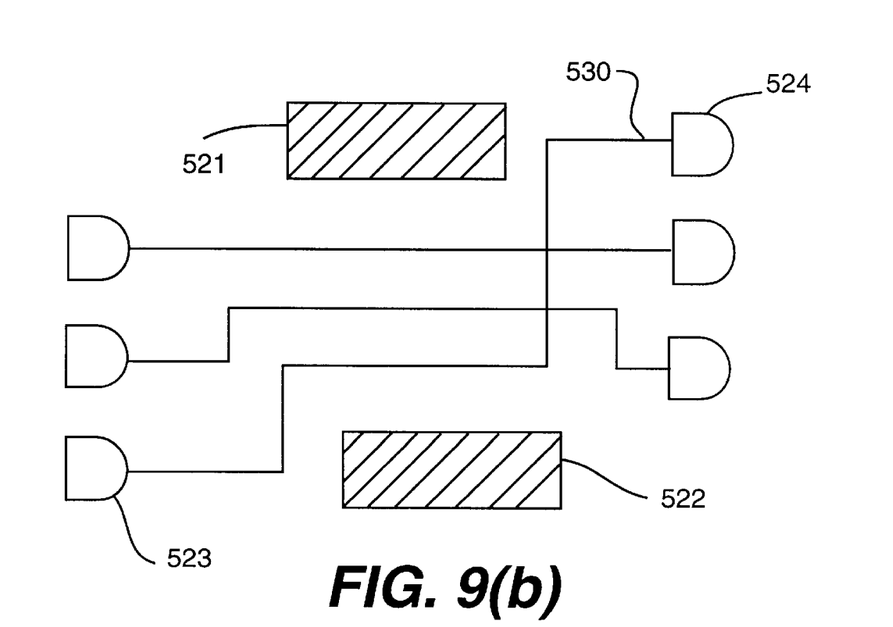

Next, consider the situation in which all of the wiring has not yet been finished, for example. Even when a trace cannot be formed between wiring-oriented gates 523 and 524 due to other nets 520 and 525 and wiring-nonoriented regions 521 and 522 as shown in FIG. 9(a), margins (designated by numeral 526) can be provided for a channel by improving the wiring layout for net 525, thereby making it possible to easily wire a net 530 between the wiring-oriented gates 523 and 524 as shown in FIG. 9(b).

The present invention has been described specifically by the illustrated embodiments. However, the present invention is not necessarily limited to these embodiments. It is within the scope of the present invention that many changes and modifications can be made without departing from the spirit or scope of the invention as set forth herein. For example, the techniques of Embodiment 1, Embodiment 2 and Embodiment 3 may be used in combination as needed.

According to the present invention, as has been described above, each of the trunk-trace lengths (wiring lengths) is determined in accordance with the channel assigning method or the like. The nets are sorted according to the trunk-trace lengths exceeding a reference value. The wiring channels each having a pitch equal to twice (or plural times) the minimum wiring interval are used preferentially from those whose trunk-trace lengths are long, to assign the trunk traces. If all of the long length trunk traces, i.e. the ones exceeding the reference value have had double pitch channels assigned to them, then a second reference value can be specified for determining which of the remaining trunk traces have trunk trace lengths exceeding the second reference value. Available double pitch channels can then be assigned to theses trunk traces after sorting them so that the longest to the shortest ones (exceeding the second reference value) can be assigned in decreasing order to the remaining double pitch channels. Therefore, the probability that the long parallel traces will be produced can be reduced by effectively utilizing the wiring channels.

Further, according to the present invention, the drive capability of the source of the intended net is compared with that of the source of a net adjacent thereto with respect to what the adjacent trace-to-trace distance will be after completion of the wiring. Alternatively, the parallel wiring-length limiting value is decided according to the drive capability of the source of the intended net and the distance of the trunk trace of the intended net to the trunk trace of an adjacent net where the trunk trace of the adjacent net begins to adjoin the trunk trace of the intended net. It is therefore possible to detect and improve parallel wiring-length failure in nets.

We claim:

1. A method of designing wiring layout for a semiconductor integrated circuit, comprising the steps of:
    estimating wiring lengths of trunk traces between terminals in wiring oriented nets of said circuit;
    allocating first wiring channels having a predetermined minimum wiring interval and allocating second wiring channels having a pitch at least twice that of said predetermined wiring interval for each of said trunk traces on the basis of the lengths of said trunk traces determined in said estimating step.

2. A method according to claim 1, further including sorting said trunk traces according to said trunk trace lengths from longest to shortest and allocating said second wiring channels to said trunk traces in decreasing order from said longest to said shortest trunk trace lengths.

3. A method according to claim 1, further including sorting said trunk traces according to said wiring lengths of said trunk traces by comparing said wiring lengths to a predetermined reference value; and
    assigning said second channels to said trunk traces having said trunk trace lengths that exceed said reference value in decreasing order beginning with ones of said trunk traces having a trunk trace length that is determined to be a longest trunk trace length.

4. A method according to claim 3, wherein said reference value is determined to be about 60% of said longest trunk trace length.

5. A method according to claim 3, further including assigning said second channels to said trunk traces determined to exceed said reference value until said second channels have been exhausted, and then assigning said first channels to the remaining trunk traces.

6. A method according to claim 1, wherein said second wiring channels have a pitch equal to twice that of said predetermined minimum wiring interval.

7. A method of designing wiring layout for a semiconductor integrated circuit, comprising the steps of:
    allocating parallel trunk traces between terminals for elements of adjacent nets of said circuit;
    determining a parallel wiring-length limiting value that limits the length of the parallel trunk traces according to a drive capability of said elements of said adjacent nets; and
    limiting the length of a parallel trunk trace in accordance with said parallel wiring-length limiting value.

8. A method of designing wiring layout for a semiconductor integrated circuit, comprising the steps of:
    allocating parallel trunk traces between terminals for sources and gates, respectively, of adjacent nets of said circuit;
    limiting the length of a parallel trunk trace in the connection between one of said sources and said gates according to a distance that said parallel trunk trace is spaced apart from said one source.

9. A method according to claim 8, wherein said length of said parallel trunk trace is limited according to the drive capability of the source-to-gate drive capability for the connection between said one source and said gates.

10. A method according to claim 8, wherein said parallel trunk trace is limited as said spaced apart distance increases.

11. A program stored on a computer readable storage medium for designing a wiring layout for a semiconductor integrated circuit, comprising:
    estimating wiring lengths of trunk traces between terminals in wiring oriented nets of said circuit;
    allocating first wiring channels having a predetermined minimum wiring interval and allocating second wiring channels having a pitch at least twice that of said predetermined wiring interval for each of said trunk traces on the basis of the lengths of said trunk traces determined in said estimating step.

12. A program according to claim 11, further including sorting said trunk traces according to said trunk trace lengths from longest to shortest and allocating said second wiring channels to said trunk traces in decreasing order from said longest to said shortest trunk trace lengths.

13. A program according to claim 11, further including sorting said trunk traces according to said wiring lengths of said trunk traces by comparing said wiring lengths to a predetermined reference value; and
    assigning said second channels to said trunk traces having said trunk trace lengths that exceed said reference value in decreasing order beginning with ones of said trunk traces having a trunk trace length that is determined to be a longest trunk trace length.

14. A program according to claim 13, wherein said reference value is determined to be about 60% of said longest trunk trace length.

15. A computer readable storage medium encoded with executable instructions representing a program for designing a wiring layout for a semiconductor integrated circuit, comprising:

estimating wiring lengths of trunk traces between terminals in wiring oriented nets of said circuit;

allocating first wiring channels having a predetermined minimum wiring interval and allocating second wiring channels having a pitch at least twice that of said predetermined wiring interval for each of said trunk traces on the basis of the lengths of said trunk traces determined in said estimating step.

16. A computer readable storage medium according to claim 15, further including sorting said trunk traces according to said trunk trace lengths from longest to shortest and allocating said second wiring channels to said trunk traces in decreasing order from said longest to said shortest trunk trace lengths.

17. A computer readable storage medium according to claim 15, further including sorting said trunk traces according to said wiring lengths of said trunk traces by comparing said wiring lengths to a predetermined reference value; and assigning said second channels to said trunk traces having said trunk trace lengths that exceed said reference value in decreasing order beginning with ones of said trunk traces having a trunk trace length that is determined to be a longest trunk trace length.

18. A computer readable storage medium according to claim 17, wherein said reference value is determined to be about 60% of said longest trunk trace length.

19. A computer readable storage medium encoded with executable instructions representing a program for designing a wiring layout for a semiconductor integrated circuit, comprising:

allocating parallel trunk traces between terminals for elements of adjacent nets of said circuit;

determining a parallel wiring-length limiting value that limits the length of the parallel trunk traces according to a drive capability of said elements of said adjacent nets; and limiting the length of a parallel trunk trace in accordance with said parallel wiring-length limiting value.

20. A program stored on a computer readable storage medium for designing a wiring layout for a semiconductor integrated circuit, comprising:

allocating parallel trunk traces between terminals for sources and gates, respectively, of adjacent nets of said circuit;

limiting the length of a parallel trunk trace in the connection between one of said sources and said gates according to a distance that said parallel trunk trace is spaced apart from said one source.

* * * * *